(12) United States Patent
Gai et al.

(10) Patent No.: US 11,069,875 B2
(45) Date of Patent: Jul. 20, 2021

(54) ENCAPSULATING METHOD AND ENCAPSULATING STRUCTURE OF OLED DISPLAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xin Gai, Beijing (CN); Liyu Fang, Beijing (CN); Jingjun Du, Beijing (CN); Lingyu Sun, Beijing (CN); Zheng Wang, Beijing (CN); Xiuyun Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 17 days.

(21) Appl. No.: 15/988,384

(22) Filed: May 24, 2018

(65) Prior Publication Data
US 2019/0097169 A1    Mar. 28, 2019

(30) Foreign Application Priority Data

Sep. 22, 2017    (CN) .......................... 201710866958.2

(51) Int. Cl.
*H01L 51/52*    (2006.01)
*H01L 51/00*    (2006.01)

(52) U.S. Cl.
CPC ........ *H01L 51/5246* (2013.01); *H01L 51/004* (2013.01); *H01L 51/5203* (2013.01); *H01L 51/5253* (2013.01); *H01L 51/5259* (2013.01)

(58) Field of Classification Search
CPC ............... H01L 51/5246; H01L 51/004; H01L 51/5253; H01L 51/5259; H01L 51/5203
(Continued)

(56) References Cited

U.S. PATENT DOCUMENTS

| 4,403,834 A * | 9/1983 | Kley .................... H04N 3/10 |
| | | 315/55 |
| 10,735,865 B2 * | 8/2020 | Stephanou ........... G02B 26/001 |

(Continued)

FOREIGN PATENT DOCUMENTS

| CN | 103323982 A | 9/2013 |
| CN | 104810484 A | 7/2015 |
| CN | 106784360 A | 5/2017 |

OTHER PUBLICATIONS

First Chinese Office Action dated Oct. 19, 2018.

*Primary Examiner* — Hrayr A Sayadian
(74) *Attorney, Agent, or Firm* — Dilworth & Barrese, LLP.; Michael J. Musella, Esq.

(57) ABSTRACT

An encapsulating method and an encapsulating structure of an organic light-emitting diode (OLED) display substrate and a display device are provided. The encapsulating method of the OLED display substrate includes: encapsulating together the OLED display substrate and a encapsulating cover having a deformation functional layer, in which the deformation functional layer is disposed in an encapsulating chamber formed between the OLED substrate and the encapsulating cover; there are gaps between a display functional layer on the OLED display substrate and the deformation functional layer; the deformation functional layer can be deformed under the action of electric field; and controlling the electric field applied to the deformation functional layer, and allowing the deformation functional layer to fill the entire encapsulating chamber.

6 Claims, 2 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2013/0136280 A1* | 5/2013 | Stephanou | H04R 31/00 |
| | | | 381/190 |
| 2015/0205022 A1* | 7/2015 | Kim | B32B 37/1292 |
| | | | 428/192 |
| 2015/0226991 A1 | 8/2015 | Han et al. | |
| 2016/0322419 A1 | 11/2016 | Ellis-Monaghan et al. | |
| 2018/0219175 A9 | 8/2018 | Yin et al. | |
| 2019/0025970 A1* | 1/2019 | Kim | H01L 27/3276 |

* cited by examiner

ENCAPSULATING METHOD AND ENCAPSULATING STRUCTURE OF OLED DISPLAY SUBSTRATE AND DISPLAY DEVICE

TECHNICAL FIELD

Embodiments of the present disclosure relates to a encapsulating method and a encapsulating structure of an OLED display substrate and a display device.

BACKGROUND

In the traditional encapsulating method of an OLED display device, after encapsulating the encapsulating cover and the OLED display substrate together through a sealant, the encapsulating chamber between the encapsulating cover and the OLED display substrate is subjected to vacuum-pumping. However, this means has certain defects. After the vacuum-pumping process is completed, there may also be traces of gas in the encapsulating chamber, so the OLED element layer cannot avoid external interference, and hence the service life of the OLED display device can be harmed.

SUMMARY

An embodiment of the present disclosure provides an encapsulating method of an organic light-emitting diode (OLED) display substrate, comprising: encapsulating together an OLED display substrate and an encapsulating cover having a deformation functional layer provided on the encapsulating cover, in which the deformation functional layer is disposed in an encapsulating chamber formed between the OLED substrate and the encapsulating cover; there is a gap between a display functional layer on the OLED display substrate and the deformation functional layer, and the deformation functional layer is capable of being deformed under an action of electric field; and controlling the electric filed applied to the deformation functional layer to allow the deformation functional layer to entirely fill the encapsulating chamber.

In an embodiment of the present disclosure, for example, in the method, encapsulating together the OLED display substrate and the encapsulating cover having the deformation functional layer provided on the encapsulating cover comprises: coating a sealant on encapsulating areas of the OLED display substrate and/or the encapsulating cover, and encapsulating together the OLED display substrate and the encapsulating cover through the sealant.

In an embodiment of the present disclosure, for example, the method further comprises: after controlling the electric filed applied to the deformation functional layer to allow the deformation functional layer to entirely fill the encapsulating chamber, curing the sealant.

In an embodiment of the present disclosure, for example, after curing the sealant, the method further comprises: controlling the electric field applied to the deformation functional layer to minify the deformation functional layer to only fill part of the encapsulating chamber.

In an embodiment of the present disclosure, for example, the curing is thermocuring or UV curing.

In an embodiment of the present disclosure, for example, before controlling the electric field applied to the deformation functional layer to allow the deformation functional layer to entirely fill the encapsulating chamber, the method further comprises: removing part of gas in the encapsulating chamber by a vacuum-pumping way.

An embodiment of the present disclosure provides an encapsulating structure of an OLED display substrate, comprising: an OLED display substrate; and an encapsulating cover arranged opposite to the OLED display substrate, in which a deformation functional layer is disposed in an encapsulating chamber between the encapsulating cover and the OLED display substrate and is capable of being deformed under an action of electric field.

In an embodiment of the present disclosure, for example, in the encapsulating structure of the OLED display substrate, the deformation functional layer comprises: a first transparent electrode layer; a second transparent electrode layer; and an electroactive polymer layer disposed between the first transparent electrode layer and the second transparent electrode layer, in which the electroactive polymer layer is capable of deforming under the action of electric field.

In an embodiment of the present disclosure, for example, in the encapsulating structure of the OLED display substrate, the deformation functional layer further comprises: a first insulating layer disposed on one side of the first transparent electrode layer away from the second transparent electrode layer; and a second insulating layer disposed on one side of the second transparent electrode layer away from the first transparent electrode layer.

In an embodiment of the present disclosure, for example, in the encapsulating structure of the OLED display substrate, a material of the electroactive polymer layer comprises at least one of the following materials: polyvinylidene fluoride (P(VDF-TrFE)), modified polyvinylidene fluoride and composite materials of CuPc copper phthalocyanine (CuPc) and polyvinylidene fluoride (P(VDF-TrFE)).

An embodiment of the present disclosure provides a display device, comprising an encapsulating structure of an OLED display substrate, wherein, the encapsulating structure of the OLED display substrate comprises: an OLED display substrate; and an encapsulating cover arranged opposite to the OLED display substrate, in which a deformation functional layer is disposed in an encapsulating chamber between the encapsulating cover and the OLED display substrate and is capable of being deformed under an action of electric field.

In an embodiment of the present disclosure, for example, in the display device, the deformation functional layer comprises: a first transparent electrode layer; a second transparent electrode layer; and an electroactive polymer layer disposed between the first transparent electrode layer and the second transparent electrode layer, in which the electroactive polymer layer is capable of deforming under the action of electric field.

In an embodiment of the present disclosure, for example, in the display device, the deformation functional layer further comprises: a first insulating layer disposed on one side of the first transparent electrode layer away from the second transparent electrode layer; and a second insulating layer disposed on one side of the second transparent electrode layer away from the first transparent electrode layer.

In an embodiment of the present disclosure, for example, in the display device, a material of the electroactive polymer layer comprises at least one of the following materials: polyvinylidene fluoride (P(VDF-TrFE)), modified polyvinylidene fluoride and composite materials of CuPc and polyvinylidene fluoride (P(VDF-TrFE)).

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

Figure 1:
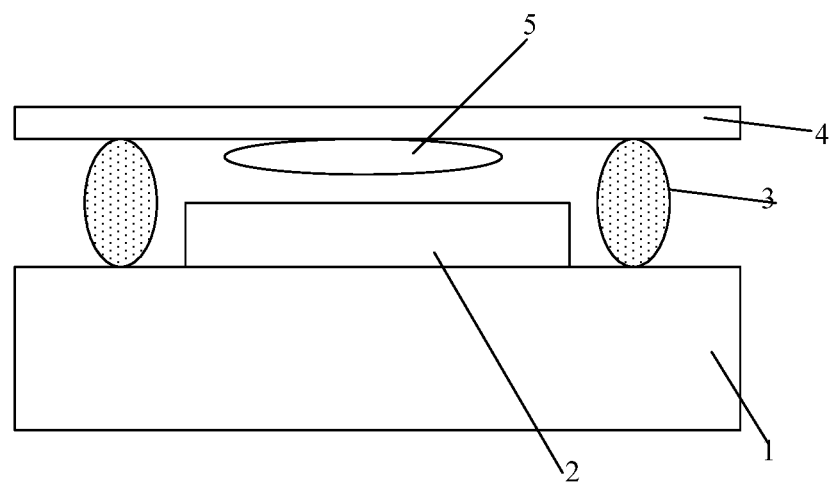
FIG. 1 is a schematic diagram of a conventional encapsulating structure of an OLED display substrate.

Reference numerals of the accompanying drawings: 1 base substrate; 2 display functional layer; 3 sealant; 4 encapsulating cover; 5 desiccant; 6 deformation functional layer; 7 UV light; 61 flexible base; 62 first insulating layer; 63 first transparent electrode layer; 64 electroactive polymer layer; 65 second transparent electrode layer; 66 second insulating layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one.

In the conventional encapsulating structure of the OLED display substrate, as shown in FIG. 1, a encapsulating cover 4 and the OLED display substrate are encapsulated together through a sealant 3; the OLED display substrate comprises a base substrate 1 and a display functional layer 2 disposed on the base substrate 1; and the encapsulating cover 4 may also be provided with a desiccant 5. After the encapsulating cover 4 and the OLED display substrate are encapsulated together, a encapsulating chamber between the encapsulating cover 4 and the OLED display substrate is subjected to vacuum-pumping. After the vacuum-pumping process is completed, traces of gas still may exist in the encapsulating chamber between the OLED display substrate and the encapsulating cover 4. With the continuous changing of the application conditions of the display device, for example, the ambient temperature ranging from e.g., −40- to 80° C., if there is gas in the encapsulating chamber, the OLED element layer cannot avoid external interference, and hence the service life of the OLED display device may be harmed.

In order to solve the above problem, embodiments of the present invention provide an encapsulating method and an encapsulating structure of an OLED display substrate and a display device, which can realize high vacuum in a encapsulating chamber between the OLED display substrate and the encapsulating cover and hence keep the OLED display substrate from suffering from external interference and improve the service life of the display device.

Figure 2:
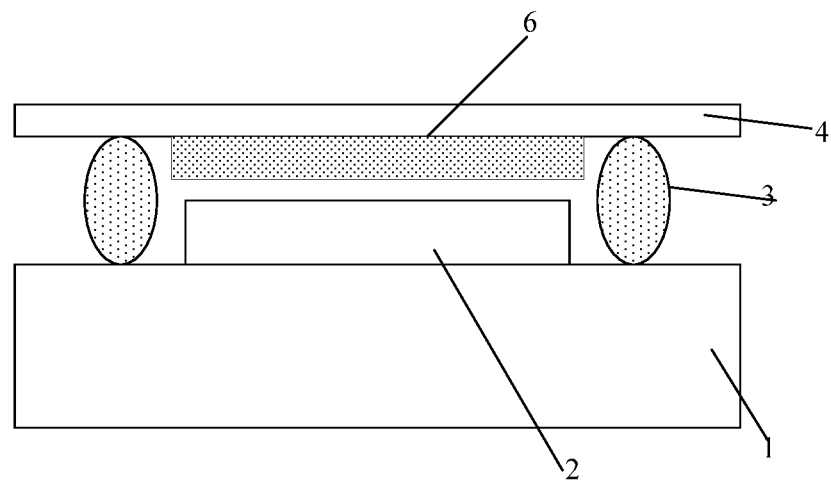
FIGS. 2-4 are schematic diagrams of a encapsulating structure of an OLED display substrate provided by the embodiments of the present invention.
Figure 3:
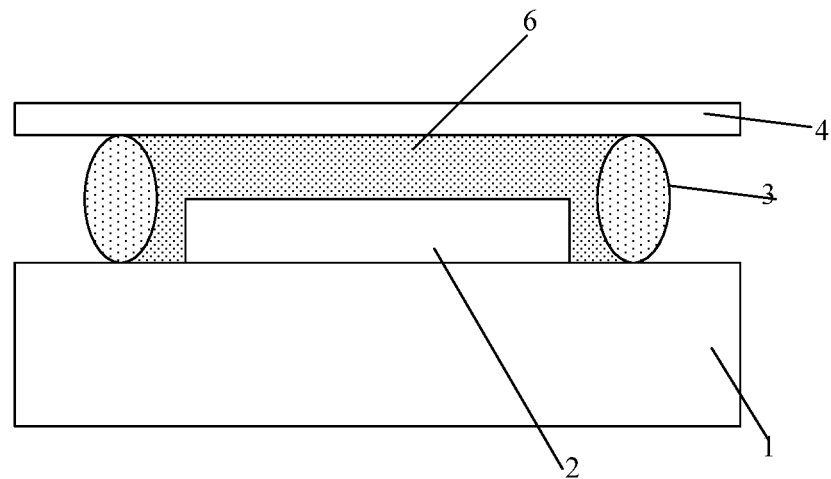

The embodiments of the present invention provide an encapsulating method of an OLED display substrate, which comprises:

as shown in FIG. 2, encapsulating together the OLED display substrate and an encapsulating cover 4 having a deformation functional layer 6, in which the deformation functional layer 6 is disposed in an encapsulating chamber formed between the OLED substrate and the encapsulating cover 4; a gap is present between a display functional layer 2 on the OLED display substrate and the deformation functional layer 6; the deformation functional layer 6 can be deformed under the action of electric field; and As shown in FIG. 3, controlling the electric field applied to the deformation functional layer 6, and allowing the deformation functional layer 6 to fill the entire encapsulating chamber.

In the present embodiment, the OLED display substrate and the encapsulating cover 4 having the deformation functional layer 6 are encapsulated together; the deformation functional layer 6 is disposed in the encapsulating chamber formed between the OLED substrate and the encapsulating cover 4; a gap is present between the display functional layer 2 on the OLED display substrate and the deformation functional layer 6; and subsequently, the electric field applied to the deformation functional layer 6 is controlled to allow the deformation functional layer 6 to fill the entire encapsulating chamber. Gas in the encapsulating chamber is pressurized and discharged in virtue of the mechanical pressure of the deformation functional layer 6, so as to ensure the high vacuum condition in the encapsulating chamber between the OLED display substrate and the encapsulating cover 4, and finally the OLED display substrate is kept from suffering from external interference, and the service life of the display device is improved.

The OLED display substrate comprises the display functional layer 2 formed on the base substrate 1. The display functional layer 2 comprises layers such as a thin-film transistor (TFT), a signal line, an anode, a cathode and a luminous material layer. In the encapsulating process, a gap is preserved between the display functional layer 2 on the OLED display substrate and the deformation functional layer 6, so as to avoid the deformation functional layer 6 from affecting the performances of the display functional layer 2. It should be noted that the deformation functional layer 6 in the present embodiment is colorless and transparent and hence will not affect the display of the OLED display substrate.

Moreover, encapsulating together the OLED display substrate and the encapsulating cover 4 having the deformation functional layer 6 comprises:

coating sealant 3 on an encapsulating area of the OLED display substrate and/or the encapsulating cover 4, and encapsulating together the OLED display substrate and the encapsulating cover 4 through the sealant 3.

Moreover, after controlling the electric field applied to the deformation functional layer 6 and allowing the deformation functional layer 6 to fill the entire encapsulating chamber, the method further comprises:

curing the sealant 3, so as to maintain the vacuum environment in the encapsulating chamber.

Figure 4:
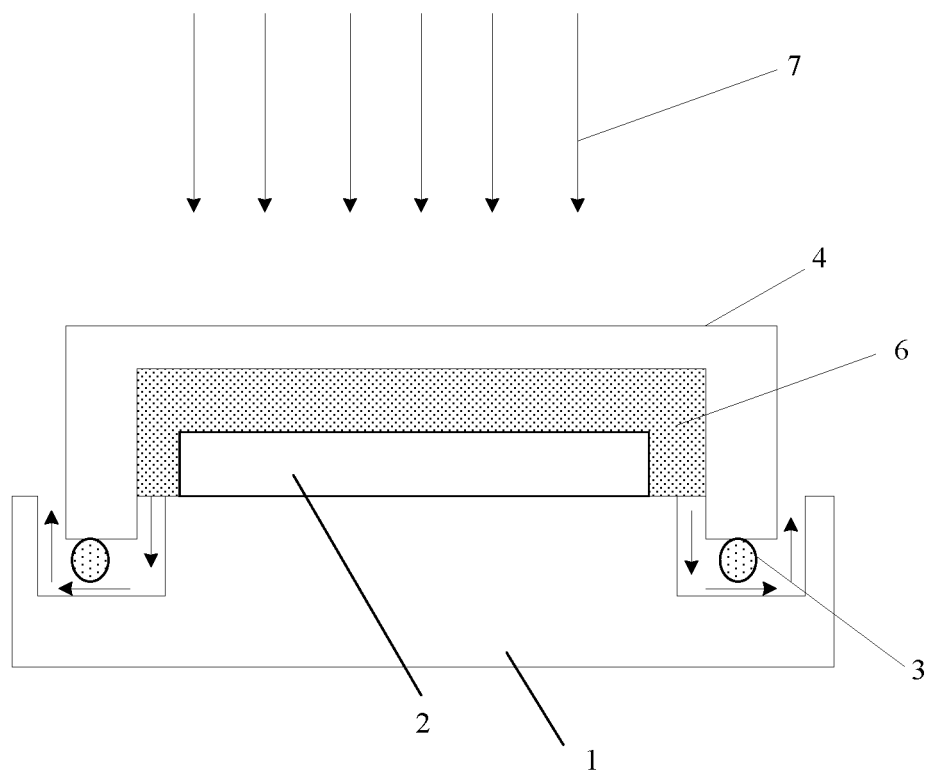

In the present embodiment, before curing the sealant 3, the deformation functional layer 6 is controlled to be deformed to fill the entire encapsulating chamber. As shown in FIG. 4, the gas pressurized by the deformation functional layer 6 may be discharged from the encapsulating chamber through non-cured sealant 3. After all the gas in the encapsulating chamber is discharged, the sealant 3 is cured, so as to maintain the vacuum environment in the encapsulating chamber.

For example, the sealant 3 may be epoxy resin. The sealant 3 may be cured by thermocuring. Moreover, as shown in FIG. 4, the sealant 3 may also be cured by UV curing, in which "7" represents UV light.

Moreover, after curing the sealant 3, the method further comprises:

controlling the electric field applied to the deformation functional layer 6, and minifying the deformation functional layer 6 to only fill partial encapsulating chamber. Thus, gaps can be preserved again between the display functional layer 2 on the OLED display substrate and the deformation functional layer 6; the display functional layer 2 and the deformation functional layer 6 do not contact each other; and then the deformation functional layer 6 will not affect the performances of the display functional layer 2. As the sealant has been cured, the vacuum environment in the encapsulating chamber can be maintained, so the deformation functional layer 6 is not necessary to fill the entire encapsulating chamber.

Moreover, before controlling the electric field applied to the deformation functional layer 6 and allowing the deformation functional layer 6 to fill the entire encapsulating chamber, the method further comprises:

removing partial gas in the encapsulating chamber by vacuum-pumping means.

If all the gas in the encapsulating chamber is pressurized and discharged by purely relying on the mechanical pressure of deformation of the deformation functional layer 6, the gas discharge efficiency will be very low. Therefore, a large part of the gas in the encapsulating chamber can be removed in advance by vacuum-pumping means, and subsequently, the remaining gas in the encapsulating chamber is pressurized and discharged in virtue of the mechanical pressure of the deformation functional layer 6.

Figure 5:
FIG. 5 is a schematic structural view of a deformation functional layer in the embodiment of the present invention.

For example, as shown in FIG. 5, the deformation functional layer 6 comprises a first insulating layer 62, a first transparent electrode layer 63, an electroactive polymer layer 64, a second transparent electrode layer 65 and a second insulating layer 66 which are disposed on a flexible base 61 in sequence, wherein the flexible base 61 may be polyethylene terephthalate (PET); the first insulating layer 62 and the second insulating layer 66 mainly have the function of isolating oxygen, moisture, dust, ray from the external environment; and the first transparent electrode layer 63 and the second transparent electrode layer 65 may adopt transparent conductive materials such as ITO or IZO, thus not affecting the display of the OLED display substrate. The key layer of the deformation functional layer 6 is the electroactive polymer layer 64. After electrical fields are applied to the first transparent electrode layer 63 and the second transparent electrode layer 65, mechanical deformation will take place in the electroactive polymer layer 64 under the action of electric fields, so as to discharge the remaining gas in the encapsulating chamber. Because a gap is present between the deformation functional layer 6 and the display functional layer 2 in the package process, the encapsulating method provided by the present embodiment can prevent the impact of the encapsulating cover 4 or plasma of other sputtering processes on the display functional layer 2. In addition, as the electroactive polymer layer 64 can be controlled by external electric filed, the flexible contact between the deformation functional layer 6 and the display functional layer 2 can be realized, and excessive force applied to the display functional layer 2 can be avoided.

For example, the material of the electroactive polymer layer 64 comprises at least one of the following: polyvinylidene fluoride (P(VDF-TrFE)), modified polyvinylidene fluoride and composite materials of CuPc and polyvinylidene fluoride (P(VDF-TrFE)). Wherein, the electrostriction deformation of the polyvinylidene fluoride and the modified polyvinylidene fluoride under the action of 150 mV/m electric field is more than 7%; and the deformation of the composite materials of CuPc and polyvinylidene fluoride (P(VDF-TrFE)) under the excitation of 13V/µm electric filed is about 2%. All the materials are flexible and transparent and will not affect the display effect of the OLED display substrate.

In one embodiment, the encapsulating method of the OLED display substrate comprises the following steps:

Firstly, providing an OLED display substrate to be encapsulated and an encapsulating cover 4 having a deformation functional layer 6, in which the encapsulating cover 4 may adopt glass substrate or quartz substrate; and the deformation functional layer 6 comprises a first insulating layer 62, a first transparent electrode layer 63, an electroactive polymer layer 64, a second transparent electrode layer 65 and a second insulating layer 66 which are sequentially disposed on a flexible base 61.

Secondly, performing preliminary encapsulation on the OLED display substrate and the encapsulating cover 4 having the deformation functional layer 6 through UV glue, and discharging most gas in the encapsulating chamber by vacuum-pumping means, in which at this point, certain gaps are preserved between the display functional layer 2 of the OLED display substrate and the deformation functional layer 6, so the yield of the OLED display substrate can be guaranteed.

Thirdly, electrifying the deformation functional layer 6, in which at this point, the deformation functional layer 6 is expanded towards the direction of the display functional layer 2, and as shown in FIG. 4, fills the entire encapsulating chamber; and the remaining gas in the encapsulating chamber is pressurized and discharged in virtue of the mechanical deformation of the electroactive polymer layer 64, so as to ensure the vacuum environment in the encapsulating chamber on the periphery of the display functional layer 2.

Fourthly, curing the UV glue by UV light irradiation, so as to maintain the vacuum condition in the encapsulating chamber and finally finish the encapsulation of the OLED display substrate.

The encapsulating method provided by the present embodiment can realize high vacuum condition in the encapsulating chamber on the periphery of the display functional layer 2 and hence avoid the OLED display substrate from suffering from external interference and improve the service life of the OLED display device.

The embodiment of the present invention further provides an encapsulating structure of an OLED display substrate, which is manufactured by the foregoing method. The encapsulating structure comprises: the OLED display substrate; and an encapsulating cover 4 arranged opposite to the OLED display substrate, in which a deformation functional layer 6 is formed in an encapsulating chamber between the encapsulating cover 4 and the OLED display substrate and can be deformed under the action of electric field.

In the present embodiment, the OLED display substrate and the encapsulating cover 4 having the deformation functional layer 6 are encapsulated together; and the deformation functional layer 6 is disposed in the encapsulating chamber formed between the OLED substrate and the encapsulating cover 4 and can be deformed under the action of the electric field. Thus, in the encapsulating process, the electric filed applied to the deformation functional layer 6 is controlled to allow the deformation functional layer 6 to fill the entire encapsulating chamber, and the remaining gas in the encapsulating chamber can be pressurized and discharged via the mechanical pressure of the deformation functional layer 6, so as to ensure the pure vacuum condition in the encapsulating chamber between the OLED display substrate and the encapsulating cover 4, prevent the OLED display substrate from suffering from external interference, and improve the service life of the display device.

For example, as shown in FIG. 5, the deformation functional layer 6 comprises:

a first transparent electrode layer 63;

a second transparent electrode layer 65; and an electroactive polymer layer 64 disposed between the first transparent electrode layer 63 and the second transparent electrode layer 65, in which the electroactive polymer layer 64 can be deformed under the action of electric filed.

For example, as shown in FIG. 5, the deformation functional layer 6 further comprises:

a first insulating layer 62 disposed on one side of the first transparent electrode layer 63 away from the second transparent electrode layer 65; and a second insulating layer 66 disposed on one side of the second transparent electrode 65 away from the first transparent electrode layer 63.

For example, the material of the electroactive polymer layer 64 comprises at least one of the following:

polyvinylidene fluoride (P(VDF-TrFE)), modified polyvinylidene fluoride or composite materials of CuPc and polyvinylidene fluoride (P(VDF-TrFE)). Wherein, the electrostriction deformation of the polyvinylidene fluoride and the modified polyvinylidene fluoride under the action of 150 mV/m electric field is more than 7%; and the deformation of the composite materials of CuPc and polyvinylidene fluoride (P(VDF-TrFE)) under the excitation of 13V/μm electric filed is about 2%. All the materials are flexible and transparent and will not affect the display effect of the OLED display substrate.

The embodiments of the present invention further provide a display device, which comprises the encapsulating structure of the OLED display substrate. The display device may be: any product or component with display function such as a TV, a display, a digital picture frame, a mobile phone and a tablet PC. The display device further comprises a flexible circuit board, a printed circuit board and a backplane.

The display device provided by the embodiments can ensure the high vacuum condition in the encapsulating chamber between the OLED display substrate and the encapsulating cover 4 and hence prevent the OLED display substrate from suffering from external interference and improve the service life of the display device.

In the method embodiments of the present invention, the serial numbers of the steps are not intended to limit the sequence of the steps. The sequence change of the steps made by those skilled in the art without creative efforts shall also fall within the scope of protection of the present invention.

It should be understood that: when an element such as a layer, a film, a region or a substrate is referred to as being disposed "on" or "beneath" another element, the element may be "directly" disposed "on" or "beneath" another element, or an intermediate element may be provided.

The present application claims the priority of the Chinese Patent Application No. 201710866958.2 filed on Sep. 22, 2017, which is incorporated herein by reference as part of the disclosure of the present application.

What is claimed is:

1. An encapsulating method of an organic light-emitting diode (OLED) display substrate, comprising:

encapsulating together an OLED display substrate and an encapsulating cover having a deformation functional layer provided on the encapsulating cover so that an encapsulating chamber is formed between the OLED substrate and the encapsulating cover, and the deformation functional layer is disposed in the encapsulating chamber; there is a gap between a display functional layer on the OLED display substrate and the deformation functional layer, and the deformation functional layer is capable of being deformed under an action of electric field; and controlling the electric filed applied to the deformation functional layer to allow the deformation functional layer to entirely fill the encapsulating chamber.

2. The encapsulating method of the OLED display substrate according to claim 1, wherein encapsulating together the OLED display substrate and the encapsulating cover having the deformation functional layer provided on the encapsulating cover comprises:

coating a sealant on encapsulating areas of the OLED display substrate and/or the encapsulating cover, and encapsulating together the OLED display substrate and the encapsulating cover through the sealant.

3. The encapsulating method of the OLED display substrate according to claim 2, further comprising:

after controlling the electric filed applied to the deformation functional layer to allow the deformation functional layer to entirely fill the encapsulating chamber, curing the sealant.

4. The encapsulating method of the OLED display substrate according to claim 3, wherein after curing the sealant, the method further comprises:

controlling the electric field applied to the deformation functional layer to minify the deformation functional layer to only fill part of the encapsulating chamber.

5. The encapsulating method of the OLED display substrate according to claim 3, wherein the curing is thermo-curing or UV curing.

6. The encapsulating method of the OLED display substrate according to claim 2, wherein before controlling the electric field applied to the deformation functional layer to allow the deformation functional layer to entirely fill the encapsulating chamber, the method further comprises:

removing part of gas in the encapsulating chamber by a vacuum-pumping way.

\* \* \* \* \*